United States Patent [19]

Pfizenmayer et al.

[11] Patent Number: 5,751,555
[45] Date of Patent: May 12, 1998

[54] ELECTRONIC COMPONENT HAVING REDUCED CAPACITANCE

[75] Inventors: Henry L. Pfizenmayer; Frederick C. Wernett, III, both of Phoenix, Ariz.

[73] Assignee: Motorola, Inc., Schaumburg, Ill.

[21] Appl. No.: 697,095

[22] Filed: Aug. 19, 1996

[51] Int. Cl.⁶ .................................. H05K 1/16
[52] U.S. Cl. .................. 361/763; 361/766; 361/772; 361/765; 361/784; 361/790; 361/836; 361/803; 330/66; 330/67; 330/276; 330/185; 330/274; 257/724; 257/786; 257/723; 257/700; 439/65; 439/68; 439/70; 439/74; 439/83
[58] Field of Search ................... 361/766, 735, 361/736, 772, 784, 790, 836, 803, 773, 774, 744, 763; 330/66, 276, 185, 274, 67; 257/724, 786, 723, 700; 439/65, 68, 70, 74, 83

[56] References Cited

U.S. PATENT DOCUMENTS

| | | | |
|---|---|---|---|
| 4,316,235 | 2/1982 | Latasiewicz | 361/681 |
| 5,142,239 | 8/1992 | Brayton et al. | 350/66 |
| 5,483,101 | 1/1996 | Shimoto et al. | 257/701 |
| 5,532,906 | 7/1996 | Hanari et al. | 361/749 |
| 5,555,159 | 9/1996 | Dore | 361/796 |

OTHER PUBLICATIONS

TOKO America, Inc., "Coils and Filters", 1995, pp. 136–137.
Plasmetex Industries, Inc., "Component Mounting Hardware", 1993, pp. 1,2,3, and 5.

*Primary Examiner*—Leo P. Picard
*Assistant Examiner*—David Foster
*Attorney, Agent, or Firm*—George C. Chen

[57] ABSTRACT

An electronic component with reduced capacitance includes a substrate (12) with an interconnect line (14), an additional substrate (11) with an interconnect line (13) wherein the substrate (12) overlies the additional substrate (11), an electronic device (15) overlying the substrate (12) and electrically coupled to the interconnect line (14) of the substrate (12), and an additional electronic device (17) having a lead (23) and an additional lead (26) wherein the lead (23) overlies the substrate (12) and is electrically coupled to the interconnect line (14) of the substrate (12) and wherein the additional lead (26) overlies the additional substrate (11) and is electrically coupled to the interconnect line (13) of the additional substrate (11).

20 Claims, 1 Drawing Sheet

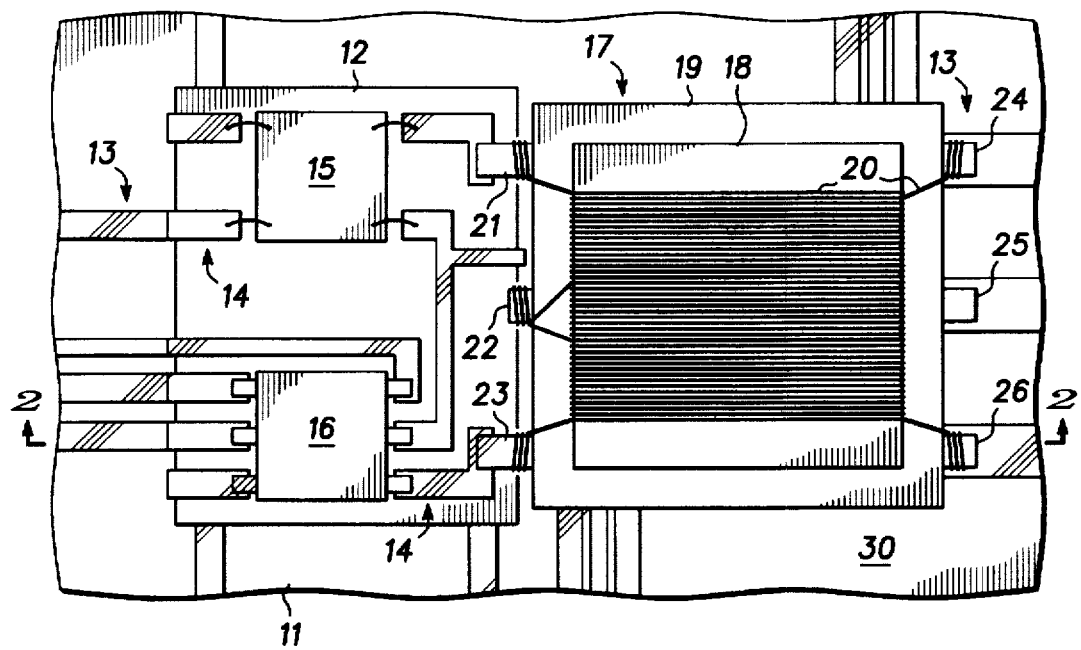
FIG. 1  *10*
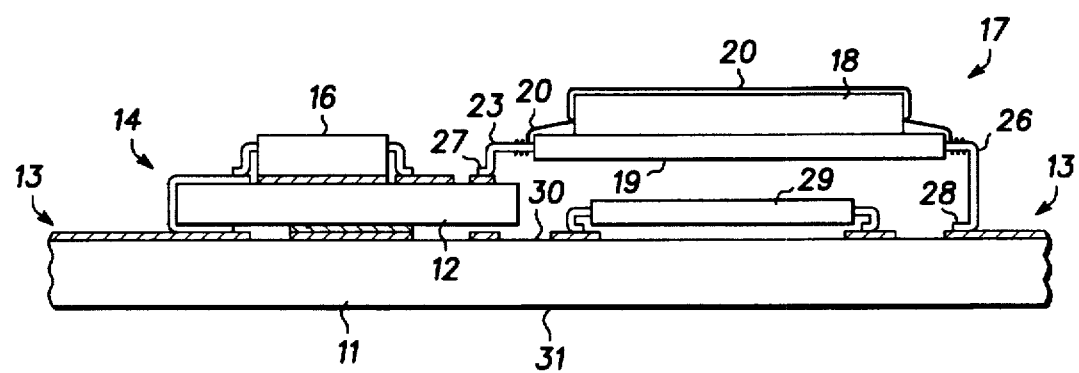
FIG. 2  *10*

ELECTRONIC COMPONENT HAVING REDUCED CAPACITANCE

BACKGROUND OF THE INVENTION

This invention relates, in general, to electronic components, and more particularly, to structures and methods for reducing capacitance in electronic components.

Many high frequency electronic components include discrete devices such as, for example, transformers and power transistors. These electronic components often suffer from low bandwidths and high assembly costs. The bandwidths of the components are degraded due to many parasitic effects including, but not limited to, stray capacitances and inductances. Furthermore, the cost and cycle time for manufacturing the components are high due to the manual labor required for assembly.

Accordingly, a need exists for a high frequency electronic component that has reduced parasitic effects. The method of manufacturing the component should be cost effective, should not significantly increase the cycle time for manufacturing the electronic component, and should be compatible with existing automated manufacturing processes to facilitate implementation

BRIEF DESCRIPTION OF THE DRAWINGS

FIG. 1 illustrates a partial top view of an electronic component in accordance with the present invention; and FIG. 2 portrays a partial cross-sectional view of the electronic component taken along a section line 2—2 of FIG. 1 in accordance with the present invention.

DETAILED DESCRIPTION OF THE DRAWINGS

FIG. 1 illustrates a partial top view of an electronic component 10, and FIG. 2 portrays a partial cross-sectional view of component 10 taken along a section line 2—2 of FIG. 1. It is understood that the same reference numerals are used in the figures to denote the same elements. Component 10 can represent any electronic component known to those skilled in the art. However, in the preferred embodiment, component 10 is a high frequency hybrid module that includes a hybrid assembly substrate 11, a carrier substrate 12, a high frequency transformer 17, and electronic devices 15, 16, and 29.

Substrates 11 and 12 are electrically insulative and can be any substrates used in the art of electronics, especially hybrid rf (radio frequency) modules. Substrate 12 is preferably comprised of a thermally conductive material to facilitate heat dissipation from component 10, and substrate 12 preferably has a low dielectric constant to reduce the parasitic capacitance of component 10, as explained in more detail hereinafter. As an example, substrate 12 can have a thickness of approximately 500–1,000 microns and can have a dielectric constant less than approximately 7.0. Accordingly, substrate 12 can be comprised of a material selected from the group consisting essentially of beryllium oxide or aluminum nitride. To reduce the cost of component 10, substrate 11 is preferably comprised of a less expensive material than that used for substrate 12. For example, substrate 11 can be comprised of aluminum oxide, which has a lower thermal conductivity and a higher dielectric constant than that of substrate 12. Substrate 11 has a top surface 30 and a bottom surface 31.

Substrates 11 and 12 have an electrically conductive path comprised of a plurality of interconnect lines 13 and 14, respectively Lines 13 and 14 are provided for illustration purposes and are not intended to define the exact electrical connections of component 10. Lines 13 and 14 can be comprised of a stack of metal layers including an adhesion layer, a low resistivity layer, a barrier layer, and a solderable layer. As an example, nickel chrome, copper, nickel, and gold can be sequentially deposited over substrates 11 and 12 and then patterned to form lines 13 and 14 using processing techniques known in the art. Lines 13 and 14 do not require a solderable layer if a subsequently described coupling process does not use solder. A ground plane for component 10 is located adjacent to surface 31 of substrate 11.

Devices 15 and 16 can be assembled or mounted over substrate 12 and can be electrically coupled to line 14 and thermally coupled to substrate 12 using automated assembly techniques known in the art. As illustrated in FIGS. 1 and 2, device 15 can be wire bonded to lines 14, and the leads of device 16 can be soldered to lines 14. Devices 15 and 16 can be any semiconductor devices known in the art including, but not limited to field effect transistors, bipolar transistors, resistors, and integrated circuits. In the preferred embodiment, devices 15 and 16 represent four bipolar transistors wired in a push-pull cascode configuration, as known in the art.

Subsequently, substrate 12 is preferably mounted over surface 30 of substrate 11 using an automated placement tool and a solder process to reduce the cost of manufacturing component 10. It is understood that substrate 12 can be coupled to substrate 11 using other techniques known in the art such as conductive epoxies or the like. As seen in FIG. 2, portions of lines 14 wrap around the side surfaces of substrate 12 to the bottom surface of substrate 12 to facilitate the electrical coupling of lines 13 and 14. In an alternative embodiment, a plurality of vias through substrate 12 can be used to facilitate the electrical coupling of lines 13 and 14 as described in U.S. Pat. No. 5,142,239, issued to Brayton et al. on Aug. 25, 1992. By using substrate 12 between substrate 11 and devices 15 and 16, the parasitic capacitance associated with devices 15 and 16 is significantly reduced.

Next, device 29 is electrically coupled to lines 13 of substrate 11. Device 29 can be a chip capacitor or a chip resistor, or device 29 can be similar to devices 15 and 16. Device 29 overlies substrate 11 and is located beneath or underlies transformer 17, which is coupled to substrate 11 after device 29 is coupled to substrate 11. Preferably, both device 29 and transformer 17 are positioned or aligned using automated assembly tools to reduce the cycle time and cost of manufacturing component 10.

Transformer 17 includes a mount or base plate 19, a plurality of leads 21, 22, 23, 24, 25, and 26, a ferromagnetic core 18, and a plurality of wires 20. Wires 20 are wrapped around core 18 in an appropriate configuration for proper high frequency tuning of transformer 17. The methods used to properly tune transformer 17 are known to those skilled in the art. It is understood that other types of transformers known in the art can be substituted for transformer 17 in FIGS. 1 and 2.

Base plate 19 of transformer 17 is preferably comprised of an electrically insulating material having a high melting point or a high deformation point temperature to withstand high temperature process steps such as, for examples a 400° C. solder dip. Base plate 19 also preferably has a low dielectric constant of less than approximately 5.0 to improve the high frequency performance of transformer 17 and component 10 by reducing the parasitic inter-electrode or inter-lead capacitance of the leads of transformer 17.

Leads 21, 22, 23, 24, 25, and 26 are comprised of electrically conductive materials such as, for example, those used in conventional semiconductor leadframes. Although transformer 17 is illustrated to have six leads in FIG. 1, it is understood that transformer 17 can have any appropriate number of leads. Wires 20 are wrapped around and electrically coupled to leads 21, 22, 23, 24, and 26. Wires 20 can have an electrically insulating coating that can be thermally removed to electrically couple wires 20 to leads 21, 22, 23, 24, and 26 during a high temperature solder dip or solder wave process. The exposed windings of wires 20 facilitates the tuning of transformer 17. Furthermore, the coupling configuration of wires 20 and leads 21, 23, 24, and 26 improves the high frequency performance of transformer 17 by reducing the parasitic inductance of prior art transformers. This reduction in parasitic inductance is accomplished by minimizing the distance of the electrical path between wires 20 and lines 13 of substrate 11 and also by minimizing the distance of the electrical path between wires 20 and lines 14 of substrate 12.

Leads 21, 22, and 23 extend from a side of base plate 19, and leads 24, 25, and 26 extend from an opposite side of base plate 19. Leads 21 and 24 are opposite and electrically isolated from each other, and leads 23 and 26 are also opposite and electrically isolated from each other In the preferred embodiment, lead 25 is electrically coupled to a voltage source (not shown) through lines 13 to provide power to transformer 17, and lead 22 is electrically coupled to lead 25 by extending through base plate 19. Wires 20 are wrapped around and electrically coupled to lead 22 to provide an operating voltage for transformer 17. However, wires 20 can also be wrapped around lead 25, instead of or in addition to lead 22, depending upon the desired tuning of transformer 17. Accordingly, lead 22 can be devoid of direct physical contact with lines 13 and 14 of substrate 11 and 12, respectively, because lead 22 is used for the direct current (d.c.) connection of transformer 17.

In the preferred embodiment, leads 21 and 23 represent a high impedance side of transformer 17, and leads 24 and 26 represent the low impedance side of transformer 17. Leads 21 and 23 overlie and are electrically coupled to lines 14, and leads 24 and 26 overlie and are electrically coupled to lines 13. Thus, the low impedance side of transformer 17 overlies substrate 11, and the high impedance side of transformer 17 overlies substrate 12, which has a lower dielectric constant than substrate 11. This mounting configuration for transformer 17 reduces the parasitic shunt capacitance to ground of component 10 because of the lower dielectric constant of substrate 12 and because of the larger space or distance between the high impedance side of transformer 17 and the ground plane of component 10. Furthermore, this mounting configuration for transformer 17 also conserves space across component 10.

In the prior art, all of the leads of a transformer are mounted over and electrically coupled to interconnect lines of a single assembly substrate Therefore, the prior art is less space efficient compared to component 10, and the prior art suffers from a reduced bandwidth because of the stray or parasitic capacitance resulting from the higher dielectric constant of the single assembly substrate In component 10, leads 21 and 23 overlie substrate 12, which has a lower dielectric constant than substrate 11, and leads 21 and 23 are directly connected to lines 14 to reduce the parasitic capacitance and increases the bandwidth of component 10 over that of the prior art.

As depicted in FIG. 2, an end portion 28 of lead 26 is bent underneath transformer 17 and points towards lead 23, and an end portion 27 of lead 23 is bent away from and points away from lead 26 Leads 24 and 25 are similar to lead 26, and lead 21 is similar to lead 23. Leads 24, 25, and 26 extend underneath base plate 19 to provide a smaller footprint for transformer 17 for conserving space across substrate 11 and component 10. Leads 21 and 23 are shorter than leads 24, 25, and 26 to support transformer 17 in a level or planar position above device 29. Thus, additional space is conserved across substrate 11 and component 10 by providing device 29 underneath transformer 17. Moreover, the configurations of leads 21, 22, 23, 24, 25, and 26 provide a sufficient spacing or distance between each of the leads and between base plate 19 and substrate 11 to permit defluxing fluid to flow underneath transformer 17. Thus, a single solder reflow process and a single deflux process can be used to simultaneously affix and deflux substrate 12, device 29, and transformer 17 to substrate 11.

Therefore, it is apparent there has been provided an improved electronic component that overcomes the disadvantages of the prior art. The present component has a reduced parasitic capacitance, a larger bandwidth of operation, improved heat dissipation, and a smaller size compared to the prior art. For example, the reduced dielectric constant of substrate 12 assists in reducing the parasitic capacitance, and the mounting of transformer 17 on substrates 11 and 12 also assists in decreasing the stray capacitance The improved heat dissipation is a result of using substrate 12, but substrate 12 does not replace substrate 11 because of the significantly lower cost of substrate 11. The automated assembly of component 10 further reduces the cost of manufacturing component 10. Additionally, the size of the component described herein is smaller due to the mounting of transformer 17 on substrates 11 and 12, the bent configuration of the leads of transformer 17, and the surface mounting of substrate 12 on substrate 11.

While the invention has been particularly shown and described with reference to preferred embodiments, it will be understood by those skilled in the art that changes in form and detail may be made without departing from the spirit and scope of the invention. For instance, the numerous details set forth herein such as, for example, the specific compositions of substrates 11 and 12 are provided to facilitate the understanding of the present invention and are not provided to limit the scope of the invention. Furthermore, the concept of mounting an electronic device on two separate substrates can be applied to electronic devices other than transformers Accordingly, the disclosure of the present invention is not intended to be limiting. Instead, the disclosure of the present invention is intended to be illustrative of the scope of the invention, which is set forth in the following claims.

We claim:

1. An electronic component comprising:

a first substrate having an electrically conductive path;

a second substrate having an electrically conductive path, the first substrate overlying the second substrate;

a first electronic device overlying the first substrate and electrically coupled to the electrically conductive path of the first substrate;

a second electronic device having a first lead and a second lead, the first lead overlying the first substrate and electrically coupled to the electrically conductive path of the first substrate, the second lead overlying the second substrate and electrically coupled to the electrically conductive path of the second substrate; and a third electronic device electrically coupled to the electrically conductive path of the second substrate, the third electronic device underlying the second electronic device and overlying the second substrate.

2. The electronic component of claim 1 wherein an end portion of the second lead is absent over the first substrate and is bent underneath the second electronic device.

3. An electronic component comprising:

a first substrate having an electrically conductive path;

a second substrate having an electrically conductive path, the first substrate overlying the second substrate;

a first electronic device overlying the first substrate and electrically coupled to the electrically conductive path of the first substrate; and a second electronic device having a first lead and a second lead, the first lead overlying the first substrate and electrically coupled to the electrically conductive path of the first substrate, the second lead overlying the second substrate and electrically coupled to the electrically conductive path of the second substrate, wherein an end portion of the second lead is located underneath the second electronic device.

4. The electronic component of claim 3 wherein an end portion of the first lead points away from the second lead.

5. An electronic component comprising:

a first substrate having an electrically conductive path;

a second substrate having an electrically conductive path, the first substrate overlying the second substrate;

a first electronic device overlying the first substrate and electrically coupled to the electrically conductive path of the first substrate; and a second electronic device having a first lead and a second lead, the first lead overlying the first substrate and electrically coupled to the electrically conductive path of the first substrate, the second lead overlying the second substrate and electrically coupled to the electrically conductive path of the second substrate, wherein the second electronic device includes a third lead wherein the third lead is devoid of direct physical contact with the first substrate and the second substrate.

6. The electronic component of claim 5 wherein the electrically conductive path of the first substrate is electrically coupled to the electrically conductive path of the second substrate.

7. An electronic component comprising:

a first substrate having an electrically conductive path;

a second substrate having an electrically conductive path, the first substrate overlying the second substrate;

a first electronic device overlying the first substrate and electrically coupled to the electrically conductive path of the first substrate; and a second electronic device having a first lead and a second lead, the first lead overlying the first substrate and electrically coupled to the electrically conductive path of the first substrate, the second lead overlying the second substrate and electrically coupled to the electrically conductive path of the second substrate, wherein the first lead is shorter than the second lead.

8. An electronic component comprising:

a first substrate having an electrically conductive path;

a second substrate having an electrically conductive path, the first substrate overlying the second substrate;

a first electronic device overlying the first substrate and electrically coupled to the electrically conductive path of the first substrate; and a second electronic device having a first lead and a second lead, the first lead overlying the first substrate and electrically coupled to the electrically conductive path of the first substrate, the second lead overlying the second substrate and electrically coupled to the electrically conductive path of the second substrate, wherein the first substrate has a lower dielectric constant than the second substrate and wherein the first substrate has a higher thermal conductivity than the second substrate.

9. An electronic component comprising:

a first electrically insulative substrate having metal lines;

a transistor mounted over the first electrically insulative substrate and electrically coupled to a first one of the metal lines of the first electrically insulative substrate and thermally coupled to the first electrically insulative substrate;

a second electrically insulative substrate having metal lines wherein the first electrically insulative substrate is mounted over the second electrically insulative substrate and wherein a portion of the metal lines of the first electrically insulative substrate are electrically coupled to a portion of the metal lines of the second electrically insulative substrate;

a transformer mount having a plurality of leads wherein a first one of the plurality of leads is mounted over and electrically coupled to a second one of the metal lines of the first electrically insulative substrate and wherein a second one of the plurality of leads is mounted over and electrically coupled to a first one of the metal lines of the second electrically insulative substrate;

a transformer core mounted over the transformer mount; and a plurality of wires wrapped around the transformer core and electrically coupled to the plurality of leads.

10. The electronic component of claim 9 wherein the first electrically insulative substrate is comprised of aluminum oxide and wherein the second electrically insulative substrate is comprised of a material selected from the group consisting of beryllium oxide or aluminum nitride.

11. The electronic component of claim 9 wherein the transformer mount has a first side and a second side opposite the first side and wherein the first one of the plurality of leads extends from the first side and wherein the second one of the plurality of leads extends from the second side.

12. The electronic component of claim 9 wherein the second one of the plurality of leads is bent underneath the transformer mount and points towards the first one of the plurality of leads.

13. The electronic component of claim 9 further comprising an electronic device electrically coupled to at least one of the metal lines of the second electrically insulative substrate wherein the electronic device is located underneath the transformer mount and over the second electrically insulative substrate.

14. The electronic component of claim 9 wherein a third one of the plurality of leads is mounted over and electrically coupled to a third one of the metal lines of the first electrically insulative substrate and wherein a fourth one of the plurality of leads is mounted over and electrically coupled to a second one of the metal lines of the second electrically insulative substrate.

15. The electronic component of claim 1 wherein the second electronic device includes a third lead devoid of direct physical contact with the electrically conductive paths of the first and second substrates and wherein the third electronic device is devoid of overlying the first substrate.

16. The electronic component of claim 1 wherein the first lead is shorter than the second lead and wherein the third electronic device is devoid of overlying the first substrate.

17. The electronic component of claim 3 wherein the second electronic component includes a third lead devoid of direct physical contact with the electrically conductive paths of the first and second substrates and wherein a dielectric constant of the first substrate is lower than a dielectric constant of the second substrate.

18. The electronic component of claim 5 further comprising a semiconductor device underlying the second electronic device, electrically coupled to the second substrate, and absent over the first substrate wherein the first lead of the second electronic device is shorter than the second lead of the second electronic device.

19. The electronic component of claim 7 wherein an end portion of the second lead is located underneath the second electronic device wherein the end portion is physically coupled to the electrically conductive path of the second substrate.

20. The electronic component of claim 8 wherein the second electronic device includes a third lead wherein the third lead is devoid of direct physical contact with the first and second substrates.

* * * * *